(12) United States Patent
Asai et al.

(10) Patent No.: US 6,533,631 B2
(45) Date of Patent: Mar. 18, 2003

(54) METHOD OF MANUFACTURING OPTICAL DEVICE WHICH OVERLIES OPTICAL OPERATION REGIONS

(75) Inventors: Nobutoshi Asai, Kanagawa (JP); Yoshinari Matsuda, Kanagawa (JP); Ryota Odake, Tokyo (JP); Yoshio Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/002,973

(22) Filed: Oct. 26, 2001

(65) Prior Publication Data

US 2002/0039872 A1 Apr. 4, 2002

Related U.S. Application Data

(62) Division of application No. 09/398,768, filed on Sep. 17, 1999, now Pat. No. 6,448,710.

(30) Foreign Application Priority Data

Sep. 25, 1998 (JP) ............................................. 10-271738

(51) Int. Cl.[7] ............................ H01J 9/00; H05B 33/00; H05B 33/04
(52) U.S. Cl. ........................ 445/24; 428/690; 313/504; 313/506
(58) Field of Search .................................. 313/504, 506, 313/509, 505; 445/24; 428/690, 917

(56) References Cited

U.S. PATENT DOCUMENTS

| | | | | |
|---|---|---|---|---|
| 4,855,190 A | * | 8/1989 | Bezner | 313/503 |
| 5,346,718 A | * | 9/1994 | Thorgersen et al. | 313/502 |
| 5,346,776 A | * | 9/1994 | Taniguchi et al. | 313/506 |
| 6,140,766 A | * | 10/2000 | Okada et al. | 313/504 |

* cited by examiner

Primary Examiner—Ashok Patel
Assistant Examiner—Mariceli Santiago
(74) Attorney, Agent, or Firm—Sonnenschein, Nath & Rosenthal (57) ABSTRACT

An optical device used as an image panel which is allowed to be arranged together with the adjacent one on a display without a gap put therebetween and which is improved to form a stacked body including organic layers without damaging the surface of an already-formed organic layer by a vapor-deposition mask, and to provide a method of manufacturing the optical device. Metal bumps are provided on stripes of transparent electrodes arranged on a glass substrate in such a manner as to be located in non-optical operation regions, and are led on the back surface of the organic EL device. The metal bumps function as spacers upon vapor-deposition of the organic layer or the like, to prevent the contact of a vapor-deposition mask with an already-formed film surface, and are led on the back surface of the organic EL device together with metal electrodes and are connected to an electronic part mounted on the back surface side of the organic EL device.

14 Claims, 10 Drawing Sheets

RELATED ART

FIG. 16

RELATED ART

RELATED ART

F I G. 21

RELATED ART

METHOD OF MANUFACTURING OPTICAL DEVICE WHICH OVERLIES OPTICAL OPERATION REGIONS

RELATED APPLICATION DATA

This application claims priority to Japanese Application No. P10-271738, filed Sep. 25, 1998 and is a divisional of U.S. application Ser. No. 09/398,768, filed Sep. 17, 1999, now U.S. Pat. No. 6,448,710, both of which are incorporated herein by reference to the extent permitted by law.

BACKGROUND OF THE INVENTION

The present invention relates to an optical device used as an image panel allowed to be connected to the adjacent one without a gap put therebetween, and a method of manufacturing the optical device.

Recently, an electroluminescence device using an organic luminescent material (hereinafter, often called an "organic EL (electroluminescence) device", which emits natural light, having a high-speed responsiveness, and is not dependent on the viewing angle, has been extensively used as a flat electronic display.

Figure 15:
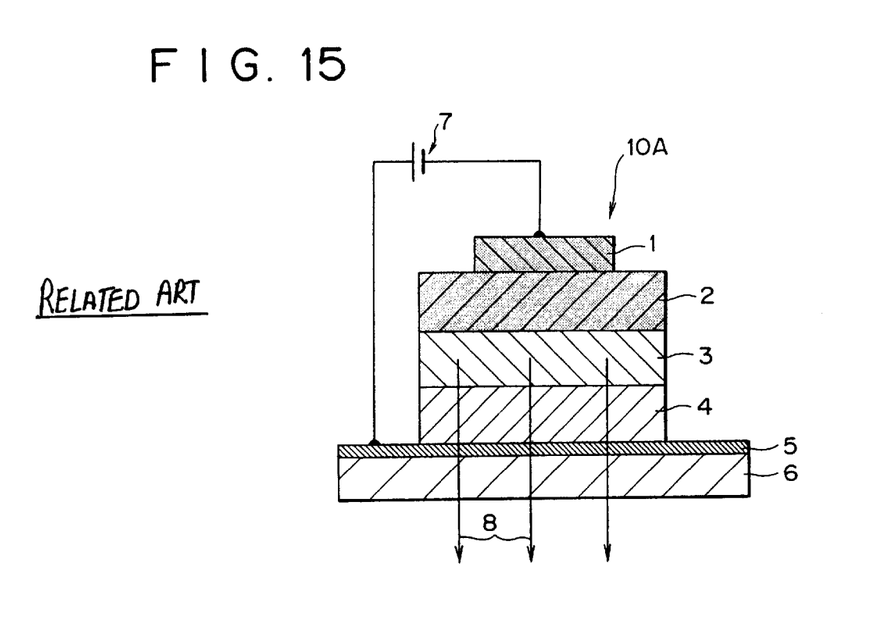
FIG. 15 is a schematic view showing a related art organic EL element.

FIG. 15 shows one example of a related art organic electroluminescence (EL) device 10A. The organic EL device 10A is of a double-hetero type in which an ITO (Indium Tin Oxide) transparent electrode 5, a hole transfer layer 4, a luminescent layer 3, an electron transfer layer 2, and a cathode (typically an aluminum electrode) 1 are sequentially formed on a transparent substrate (typically a glass substrate) 6 by a vacuum vapor-deposition method or the like.

When a DC voltage 7 is selectively applied between the transparent electrode 5 as an anode and the cathode (hereinafter, often called a metal electrode) 1, holes as carriers injected from the transparent electrode 5 migrate through the hole transfer layer 4 while electrons injected from the cathode 1 migrate through the electron transfer layer 2, to cause re-combination of the electrons and the holes, thereby emitting light 8 having a specific wavelength. Such light can be observed from the transparent substrate 6 side.

Figure 16:
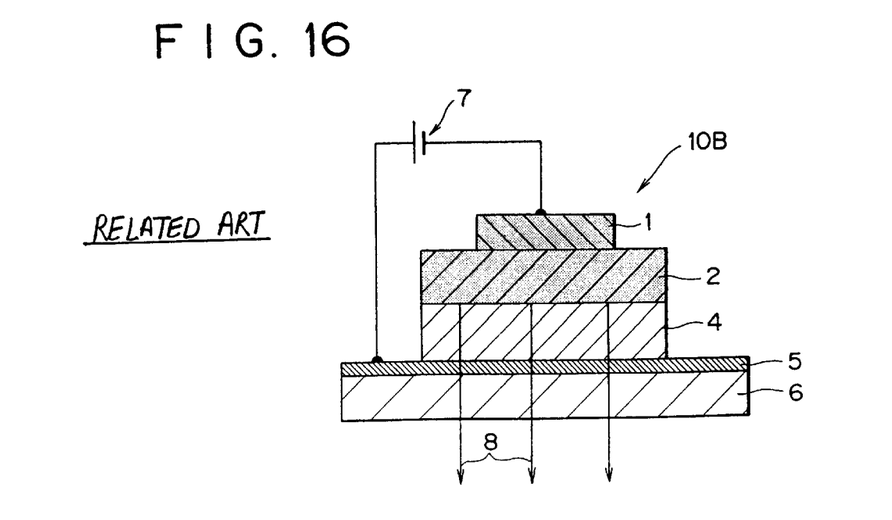
FIG. 16 is a schematic view showing another related art organic EL device.

FIG. 16 shows another prior art example using an organic luminescent material, in which a hole transfer layer material or an electron transfer material serves as the luminescent material. Concretely, FIG. 16 shows an organic EL device 10B of a single-hetero type including an electron transfer layer 2 containing the luminescent material in place of omission of the luminescent layer 3 of the example shown in FIG. 15, whereby light 8 having a specific wavelength is emitted from the interface between the electron transfer layer 2 and a hole transfer layer 4.

Figure 17:
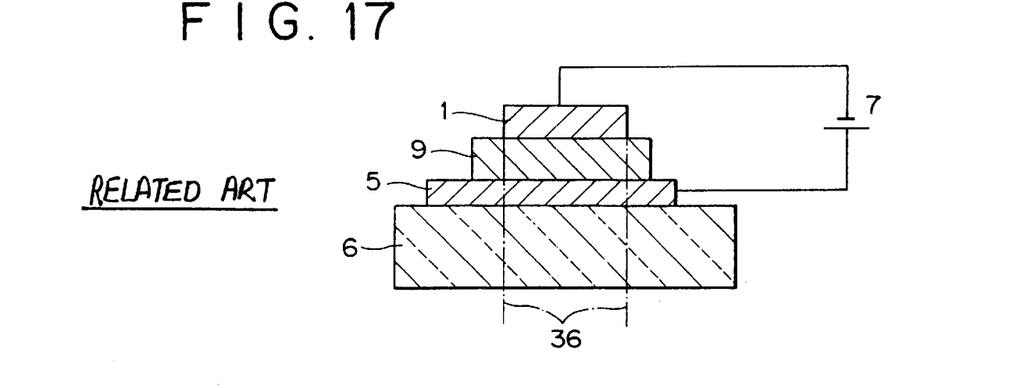
FIG. 17 is a schematic view showing a further related art organic EL device.
Figure 18:
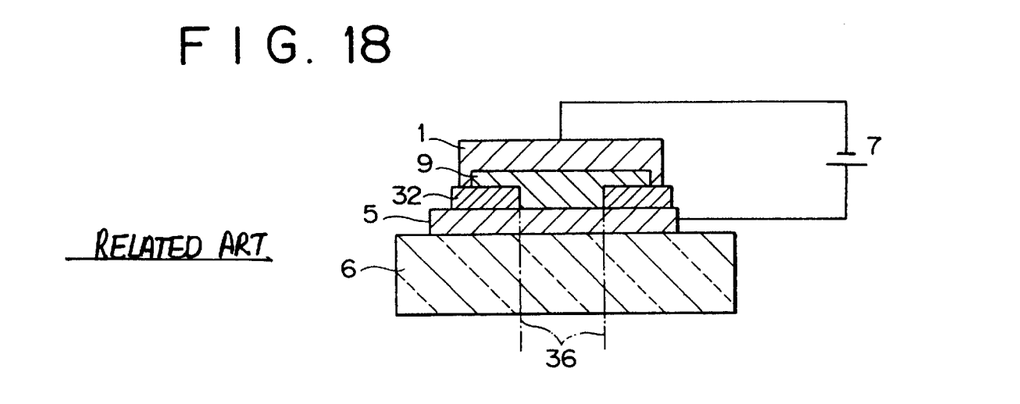
FIG. 18 is a schematic view showing still a further related art organic EL device.
Figure 19:
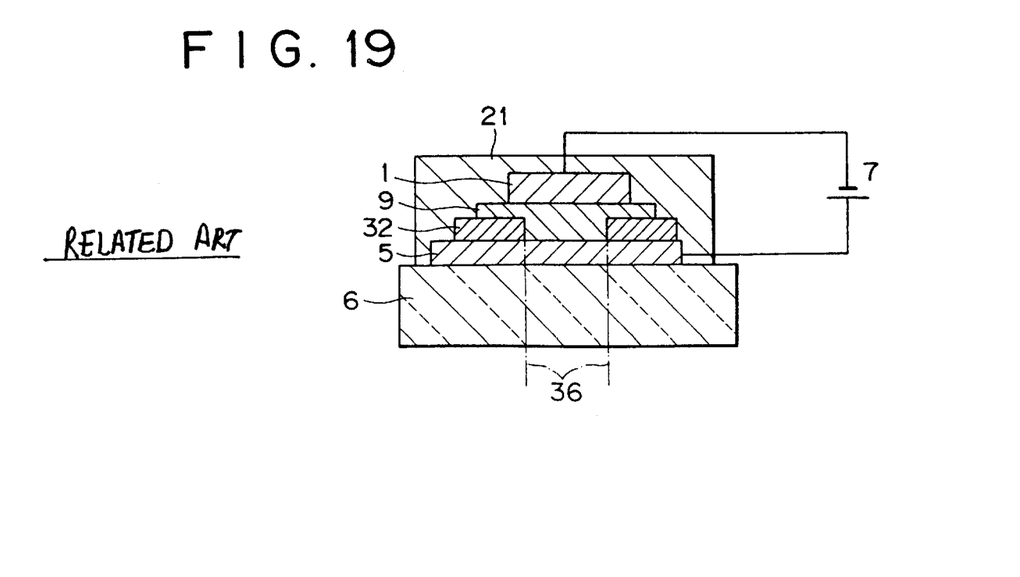
FIG. 19 is a schematic view showing an additional related art organic EL device.

FIGS. 17 to 19 show examples each having a basic configuration similar to that shown in each of FIGS. 15 and 16 and additionally including another element. In these figures, the electron transfer layer 2, the luminescent layer 3 (which is omitted in FIG. 16), and the hole transfer layer 4 shown in FIGS. 15 and 16 are collectively shown as an organic layer 9.

FIG. 17 shows the most basic example, in which a region where light emitted from an organic layer 9 is reflected from a metal electrode 1 becomes a luminescent region 36.

FIG. 18 shows the example in which a metal electrode 1 is formed in such a mariner as to entirely cover an organic layer 9 and the peripheral edge of the organic layer 9 is insulated from the transparent electrode 5 by means of an insulating layer 32. In this example, since the insulating layer 32 is protruded in the peripheral edge portion of the organic layer 9, a luminescent region 36 is correspondingly narrower than that shown in FIG. 17; however, the deterioration of peripheral edge portion of the organic layer 9 can be prevented by the presence of the insulating layer 32.

FIG. 19 shows the example in which the stacked body on the transparent substrate 6 in the structure shown in FIG. 18 is covered with a protective layer 21. This example is effective to prevent the oxidation of the organic EL device (particularly, metal electrode) and hence to improve the durability of the organic EL device.

Figure 20:
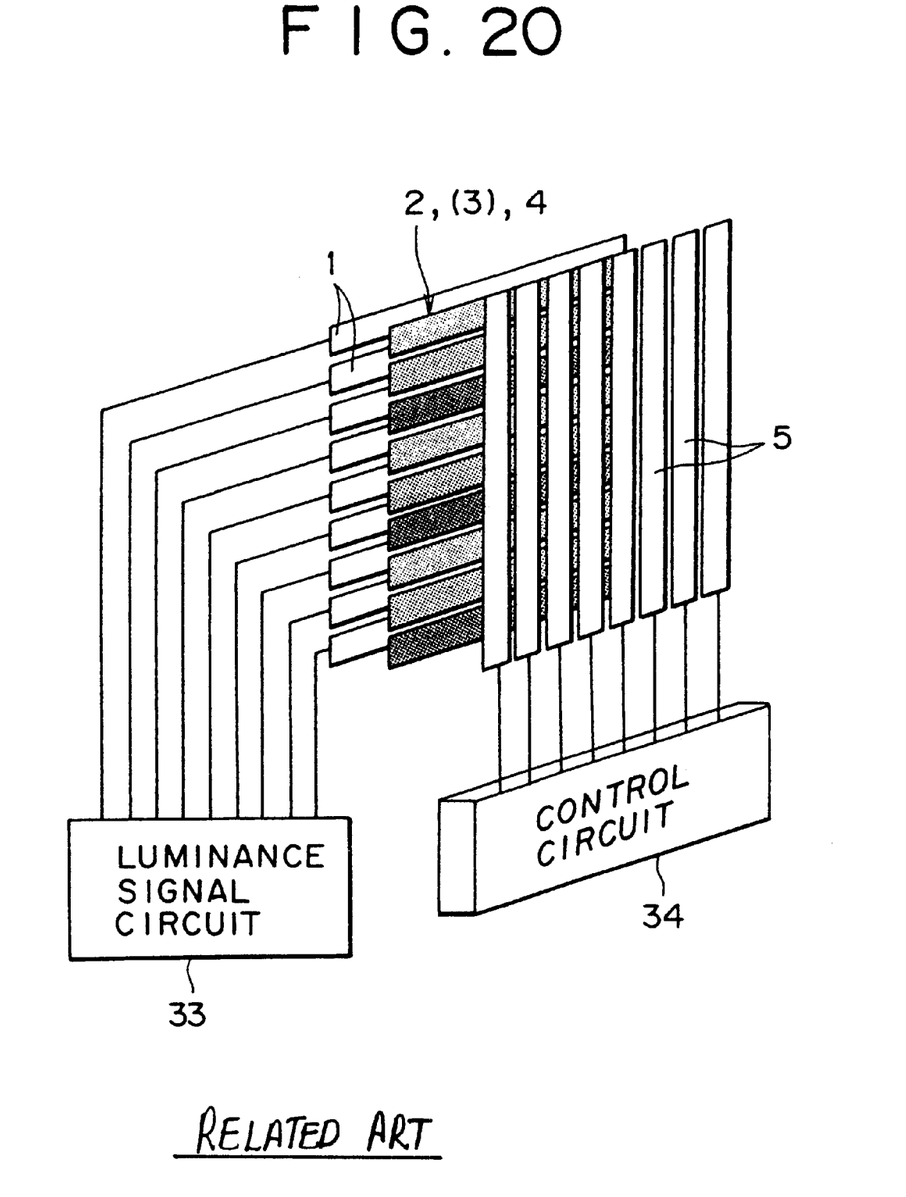
FIG. 20 is a schematic perspective view showing a practical example of an organic EL device.

FIG. 20 shows an practical example of the above-described organic EL device. In this example, a stacked body of organic layers (a hole transfer layer 4, a luminescent layer 3 (which may be omitted), and an electron transfer layer 2) is disposed between stripes of cathodes 1 and stripes of anodes 5 which cross the stripes of the cathodes 1 in a matrix. Signal voltages are applied between the cathodes 1 and the anodes 5 in time series from a luminance signal circuit 33 and a control circuit 34 containing a shift register, to emit light at a number of crossing positions (pixels).

The organic EL device having the above configuration can be used not only as a display but also as an image reproducing apparatus. It should be noted that by arranging the above stripe patterns for each of red, green and blue, the organic EL device can be used as a full-color or multi-color type display or image reproducing apparatus.

As shown in FIG. 20, a driver circuit or the like has been connected to a flat luminescence device such as an organic EL device by drawing row electrodes and column electrodes up to the outer edge side of an image display region, and bonding FPCs (flexible print circuits) to the electrodes using an anisotropic conductive adhesive or the like.

Figure 21:
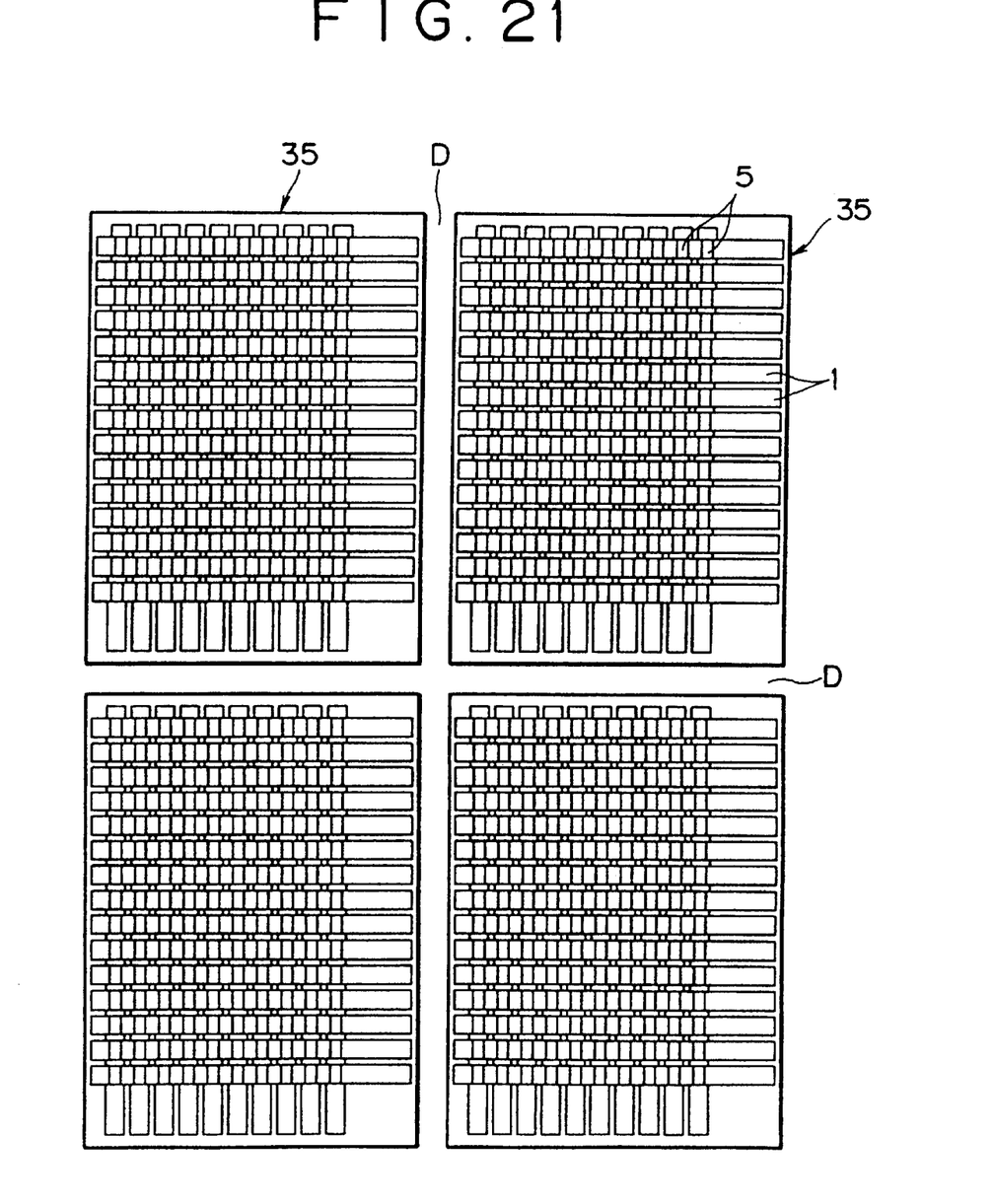
FIG. 21 is a plan view showing a state in which organic EL devices are disposed on a display.

Accordingly, when a plurality of organic EL devices are flatly connected to each other on a display as shown in FIG. 21, it becomes essential to put a specific distance D as a wiring space between adjacent ones of the organic EL devices.

Such a connection method, however, has the following problem. Since a plurality of the organic EL devices are connected to each other with gaps put therebetween, if the organic EL devices are used as image panels for a display, the image panels cannot be connected to each other without formation of relatively wide seams, thereby failing to clearly form one continuous image on the display. As a result, the image panels composed of the above organic EL devices cannot be used, particularly, for a tiling display in which the image panels are required to be arranged as closely-laid tiles.

To solve the above problem, the present inventor has proposed a method of forming a hard coat layer on the back side of an organic EL device, forming holes in the hard coat layer at electrode portions to expose electrodes, leading the electrodes onto the hard coat layer by printing a conductive paint on the hard coat layer in such a manner as to bury the holes with the paint, to thus form a wiring pattern on the hard coat layer, and mounting a driver IC on the hard coat layer; however, it has been found that such a method has a room to be improved.

On the other hand, in manufacture of a simple matrix type display in which luminescent pixels of an organic EL device are two-dimensionally arranged, a back surface side electrode layer must be processed into a stripe pattern. Further, in manufacture of a full-color display, a luminescent layer of an organic EL device must be processed into a pattern.

Since organic layers of an organic EL device are weak against a solvent, it is difficult to process them by lithography using a resist. Accordingly, each organic EL layer is processed into a pattern by vapor-deposition using a mask. Such vapor-deposition using the mask requires complicated steps. In this case, as the pattern becomes finer, the mask is made as close to the substrate as possible for reducing the degree of runabout of a material to be vapor-deposited on the back side of the mask.

If the mask is brought into contact with the substrate, however, it may damage and/or contaminate an already-formed organic EL layer. For this reason, it has been expected to interpose spacers each having a specific height between the substrate and the mask. With respect to these spacers, if the spacers interposed between the substrate and the mask are positioned not at an image area of the substrate but at the outer ends thereof, it is required to make the substrate and the mask as flat as possible, and particularly, if the mask is thin, it is required to provide a mechanism of imparting a tension to the mask.

SUMMARY OF THE INVENTION

An object of the present invention is to provide an optical device which is allowed to be connected to the adjacent one without a gap put therebetween and to be connected to parts to be mounted and which is improved to form a stacked body including organic layers without damaging the surface of an already-formed organic layer by a vapor-deposition mask, and to provide a method of manufacturing the optical device.

To achieve the above object, according to a first aspect of the present invention, there is provided an optical device including: electrodes arranged on a base; a stacked body provided on the electrodes in such a manner as to cover at least optical operation regions; an insulating layer formed in such a manner as to cover the top surface of the stacked body; and conductive projections provided on the electrodes in such a manner as to be located in non-optical operation regions; wherein the projections are buried in through-holes formed in the insulating layer in such a manner that the top surfaces of the projections are higher than the top surface of the stacked body and also nearly equal to or less than the top surface of the insulating layer; and exposed portions of the projections are electrically led onto the insulating layer.

The invention having the above configuration has the following advantages. Since the conductive projections provided on the electrodes in the non-optical operation regions are electrically led onto the insulating layer, a part (for example, electronic part) to be mounted on the insulating layer can be wired to the lead portions of the projections. Accordingly, the optical elements (for example, organic EL devices) can be flatly connected to each other without gaps put therebetween. Also, when the exposed portions of the projections are electrically led onto the insulating layer, a conductive layer can be formed in such a manner as to be desirably stuck on the exposed portions of the projections because the top surfaces of the projections buried in the through-holes formed in the insulating layer are equal to or less than the top surface of the insulating layer. This is effective to facilitate formation of wiring for the projections and hence to stabilize the mounting of the electronic part. Further, since the top surfaces of the projections are higher than the surface of the stacked body, the projections can function as spacers for vapor-deposition masks upon formation of the stacked body in the optical operation regions, so that it is possible to prevent from damaging the surface of an already-formed film by the mask.

According to a second aspect of the present invention, there is provided a method of manufacturing an optical device in which a stacked body is provided on electrodes arranged in a base in such a manner as to cover at least optical operation regions and the top surface of the stacked body is covered with an insulating layer, the method including the steps of: forming conductive projections on the electrodes in such a manner that the projections are located in non-optical operation regions and the top surfaces of the projections are higher than the top surface of the stacked body; and disposing a mask on the projections which are taken as spacers, and forming layers constituting the stacked body through the mask.

In accordance with the present invention, it is possible to manufacture the above-described optical device with a high reproductivity. Further, since the conductive projections are higher than the top surface of the stacked body, connection portions of wires connected to a part (for example, an electronic part) to be mounted are led out via the projections, so that it is possible to omit the step of forming through-holes for connection with the part to be mounted, and hence to improve the productivity.

In the above optical device and the method of the manufacturing the optical device according to the present invention, preferably, the projections are composed of metal bumps provided on the electrodes; a conductive layer is formed on the metal bumps in such a manner as to cover the metal bumps and is then processed into a conductive pattern. The metal bumps may be made from nickel paste, silver paste, or carbon paste.

The method of manufacturing an optical device, preferably, further includes the steps of: forming the electrodes on the base using a first mask having a specific pattern; forming the projections having a specific pattern in the non-optical operation regions on the electrodes by a physical vapor-deposition method or a plating method; and disposing a second mask having a specific pattern on the projections, and forming at least counter electrodes facing to the electrodes, among components of the stacked body by the physical vapor-deposition method.

DETAILED DESCRIPTION OF THE PREFERRED EMBODIMENT

Hereinafter, a preferred embodiment of the present invention will be described in the order of manufacturing steps with reference to the accompanying drawings.

Figure 1:
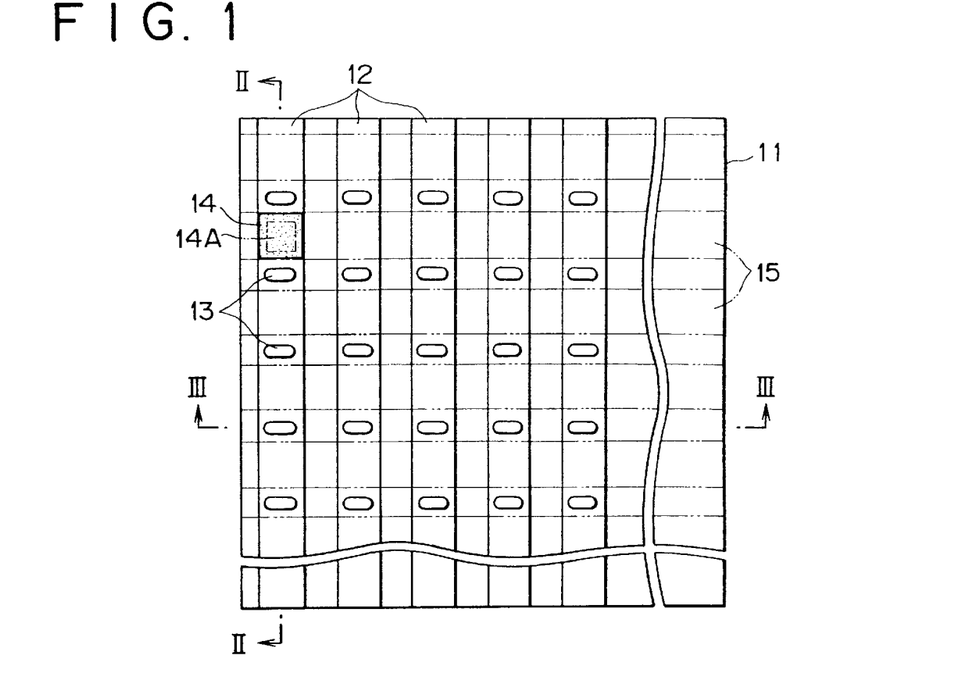
FIG. 1 is a schematic plan view of an organic EL device at a manufacturing step according to an embodiment of the present invention.

FIG. 1 is a schematic plan view of a structure of an organic El device at one manufacturing step. Here, the organic EL device is configured as a simple matrix type monochrome organic EL device used for a display, in which the pitch of pixels is set at 1 mm and the size of a luminescent pixel is 0.7 mm×0.7 mm. First, stripes of ITO transparent electrodes 12 are formed to a thickness of 200 nm on a glass substrate 11 having a thickness of about 1 mm in such a manner that the stripes of the ITO transparent electrodes 12, each having a width of 0.7 mm, are arranged with a pitch of 1 mm. On the transparent electrodes 12, metal bumps 13 each having a size of 0.1 mm×0.6 mm and having a thickness of 20 $\mu$m are formed, by a vacuum film formation method or a plating method, in regions where the luminescent pixels 14 are to be not formed.

Figure 2:
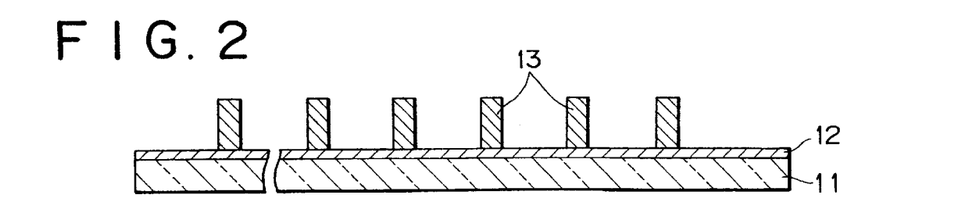
FIG. 2 is a sectional view taken on line II—II of FIG. 1.
Figure 3:
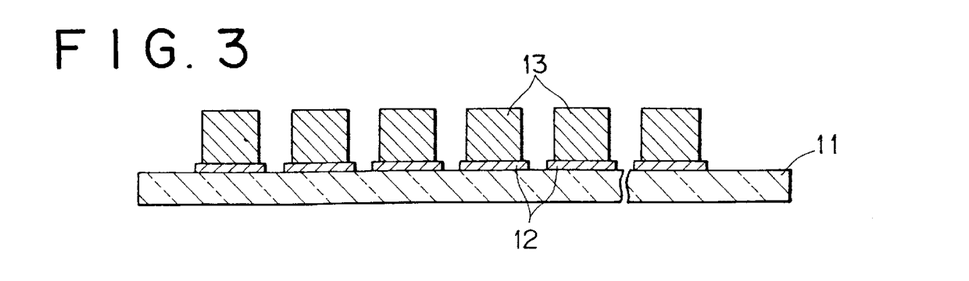
FIG. 3 is a sectional view taken on line III—III of FIG. 1.

FIG. 2 is a sectional view taken on line II—II of FIG. 1, and FIG. 3 is a sectional view taken on line III—III of FIG. 1.

The metal bump formation method is not limited to that described above. For example, there may be adopted the following method. An insulating layer is provided on the transparent electrodes 12, and openings or windows having a size of 0.7 mm×0.7 mm are formed in the insulating layer. The region in the window is taken as a luminescent pixel 14A shown by an imaginary line in FIG. 1. In this case, the size of the outer edge of the window formed in the insulating layer may be set to be slightly narrower than the size of the region taken as the luminescent pixel 14. This is effective to prevent deterioration due to concentration of a current at the edges of a luminescent pixel (that is, a crossing portion between electrodes) and short-circuit between the electrodes because the edges of the luminescent pixel are not exposed to the window. Subsequently, windows are provided in the insulating layer at positions where the metal bumps 13 are to be formed in order that the metal bumps 13 will be formed later in a state being conducted to the transparent electrodes 12.

Since the metal bumps 13 thus formed are separated from the luminescent pixels, if they damage portions of the organic EL layer therearound, they do not damage the luminescent pixels. Also since the metal bumps 13 are formed in regions where counter electrodes are not to be formed, they can function as spacers upon vapor-deposition for forming the counter electrodes. It should be noted that the planar shape of the metal bump is not limited to that described above but may be arbitrarily selected.

In the case of forming organic layers of a monochrome organic EL device on the glass substrate 11 on which the transparent electrodes 12 and the metal bumps 13 have been formed, each organic layer may be continuously formed over the entire surface of the glass substrate 11 without use of any vapor-deposition mask; however, it may be formed by using the mask into a pattern having separate portions arranged in accordance with the arrangement of the pixels. The organic layers of the organic EL device are formed as follows. For example, in the case of forming a green color organic EL device, a CuPC (copper phthalocyanine) film having a thickness of 25 nm and an m-MTDATA (tris(3-methylphenylphenylamino)triphenylamine) film having a thickness of 15 nm are formed as a hole transfer layer; an $\alpha$-NPD ($\alpha$-naphthylphenyldiamine) film having a thickness of 30 nm is formed as a luminescent layer; and an Alq$_3$ (8-hydroxyquinoline aluminum) film having a thickness of 50 nm is formed as an electron transfer layer. The usable organic materials are not limited thereto. Each film thickness is not limited to the above value; however, the above film thickness is desirable for obtaining high efficient light emission.

To form each of organic layers of a full-color (red, green and blue) type organic EL device into stripes, the organic EL layer must be formed by vapor-deposition using a mask. In this case, the organic EL layer may be formed by single vapor-deposition using a stripe-shaped mask or by repeating vapor-deposition by a plurality of times while shifting a dot-shaped mask, into a stripe pattern having stripes extending in the direction perpendicular to the stripes of the stripe pattern of the transparent electrodes 12.

To prevent the runabout of a vapor-deposition material under the mask, the vapor-deposition mask may be made as close to the substrate as possible, and also the vapor-deposition mask may be desirable to be made from an alloy containing a ferromagnetic material such as iron, nickel or cobalt, particularly, a Kovar alloy having a thermal expansion coefficient close to that of glass.

The elasticity of the mask may be set such that the mask is not soft to such an extent as to be deflected by 20 $\mu$m per 1 mm but is not excessively hard in order to follow the shape of a glass substrate by a magnetic attraction force even if the substrate is somewhat warped; and the thickness of the mask may be desirable to be in a range of about 50 $\mu$m to about 200 $\mu$m. The thickness of the mask, which is dependent on the size of a pixel, is required to become smaller as the vapor-deposition pattern becomes finer.

A magnet is disposed on a holder of the glass substrate in order to attract the mask closely to the substrate by a magnetic force. Since the mask is in contact with only the top surfaces of the metal bumps formed on the glass substrate, the luminescent pixel regions are not in contact with the mask, to be thus protected therefrom.

The counter electrodes, which are generally configured as cathodes, are formed by vapor-depositing a metal having a small work function in vacuum. To enhance the current injection efficiency of the organic EL device and hence to allow the device to emit bright light at a low voltage, the cathodes may be formed by vapor-depositing an Li—Al alloy or an Mg—Ag alloy. Alternatively, an Mg—In alloy or single Al may be used. A dielectric layer having a thickness ranging from about 0.5 nm to about 1 nm may be inserted between the metal layer forming the cathodes and the organic layer. The dielectric layer may be made from a material selected from fluorides and oxides of alkali elements or alkali earth elements, for example, LiF, $Li_2O$, $CaF_2$ and CaO.

Figure 4:
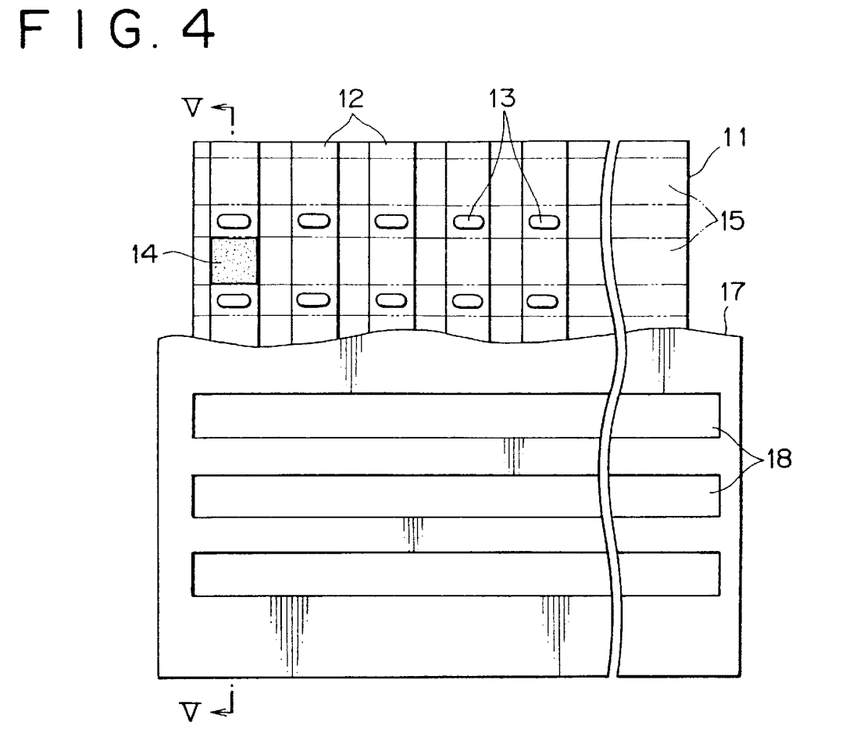
FIG. 4 is a schematic plan view showing a manufacturing step for the organic EL device according to the present invention.

FIG. 4 is a schematic plan view showing a state in which after formation of the metal bumps 13, an organic layer 19 (which includes an organic hole transfer layer, an organic luminescent layer and/or an organic electron transfer layer, and which is not shown in FIG. 4) is formed over the entire surface without use of any mask and a mask 17 for forming counter electrodes is set.

Figure 5:
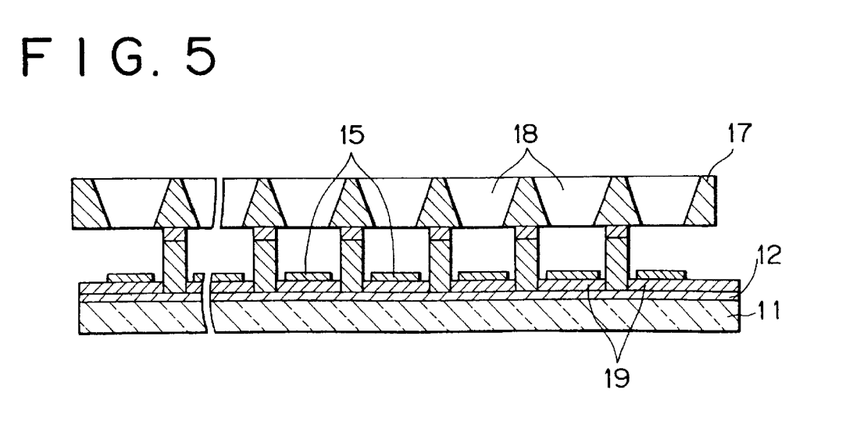
FIG. 5 is a sectional view taken on line V—V of FIG. 4.

FIG. 5 is a sectional view taken on line V—V of FIG. 4 showing a state in which the organic layer 19 is formed on the entire surface of the glass substrate 11 on which stripes of the transparent electrodes 12 have been formed; the mask 17 is set by using the metal bumps 13 as spacers; and metal electrodes (cathodes) 15 are formed through openings 18 of the mask 17. As described above, the height (thickness) of the metal bumps 13 is 20 μm, which is sufficiently larger than the total (1 μm or less) of the thicknesses of the organic layer 19 and the metal electrode 15. As a result, the already-formed film portion is not damaged by the mask 17.

Figure 6:
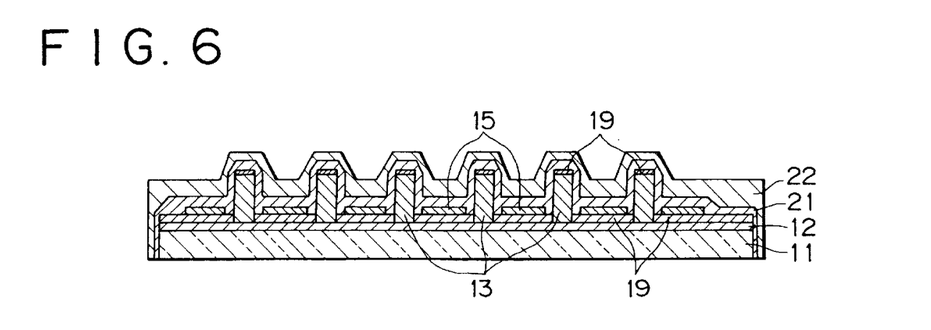
FIG. 6 is a schematic sectional view showing a manufacturing step subsequent to that shown in FIG. 4.

Referring to FIG. 6, after formation of the metal electrodes 15 as the counter electrodes, a protective film 21 and a hard coat layer 22 are formed over the entire surface. The protective film 21 may be formed by sputtering or CVD (Chemical Vapor Deposition) using an insulating material such as carbon, a-Si (amorphous silicon), SiN, $SiO_2$, $Al_2O_3$, AlN or $TiO_2$. The protective film 21 is adapted to prevent formation of non-luminescent regions (dark regions) due to permeation of water or the like from edges of the electrodes and defects. The hard coat layer 22 may be made from a material allowed to be hardened at a relatively low temperature, for example, a polyester based resin sold by Asahi Kagaku Kenkyuujo (Asahi Chemical Laboratory) under the trade name "CR-18G-KF". This material can be hardened at a dry condition of 100°C.×20 min. Even in screen printing of the hard coat material, the metal bumps 13 function as spacers for protecting the surface of the organic EL layer.

Figure 7:
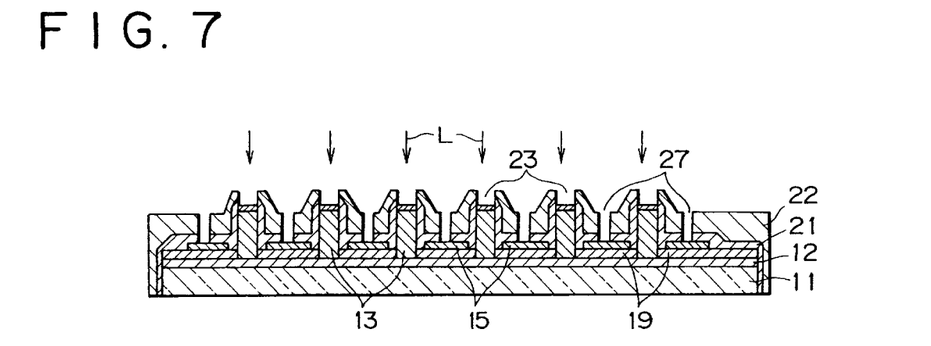
FIG. 7 is a schematic sectional view showing a manufacturing step subsequent to that shown in FIG. 6.

Referring to FIG. 7, through-holes 23 and 27 are formed in both the protective film 21 and the hard coat layer 22 by laser processing in such a manner as to reach the metal bumps 13 and the metal electrodes 15, respectively. In the case where the metal bumps 13 are not exposed by formation of the insulating film over the entire surface after formation of the counter electrodes as described above, the top surfaces of the projections are exposed by removing part of the insulating film.

In this case, if the hard coat layer 22 is formed to a thickness ranging from 10 μm to 20 μm by screen printing, the film thickness of the hard coat 22 on the metal bumps 13 becomes about several μm. Accordingly, as the height of the metal bumps 13 becomes larger, the film thickness of the hard coat layer 22 on the metal bumps 13 becomes smaller. As a result, by setting the height of the metal bumps 13 at a large value, it is possible to reduce the laser power and a working time required for processing, and hence to improve the productivity.

Figure 8:
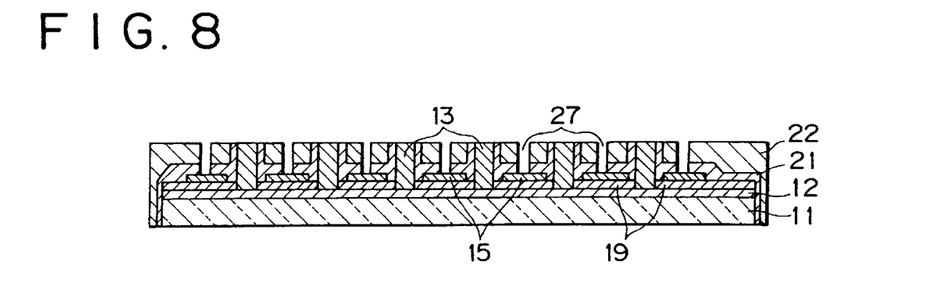
FIG. 8 is a schematic sectional view showing a manufacturing step subsequent to that shown in FIG. 7.

Referring to FIG. 8, after exposure of the top surfaces of the metal bumps 13, the top surfaces are planarized by mechanical polishing. With respect to this mechanical polishing, if the metal bumps 13 sufficiently project with respect to the surface of the hard coat layer 22, the metal bumps 13 can be exposed by this mechanical polishing in place of the above-described laser processing.

Figure 9:
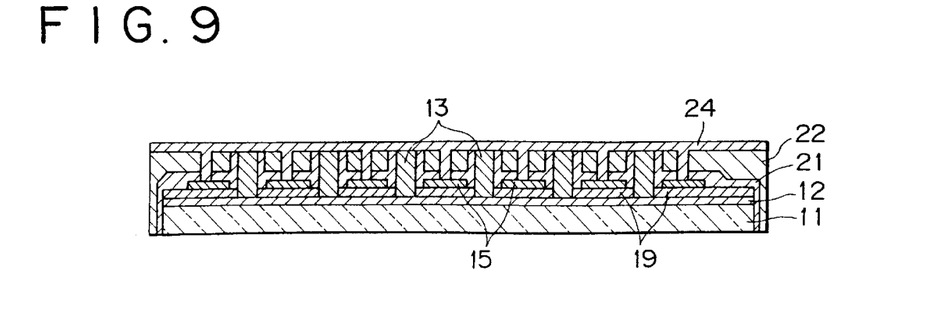
FIG. 9 is a schematic sectional view showing a manufacturing step subsequent to that shown in FIG. 8.
Figure 10:
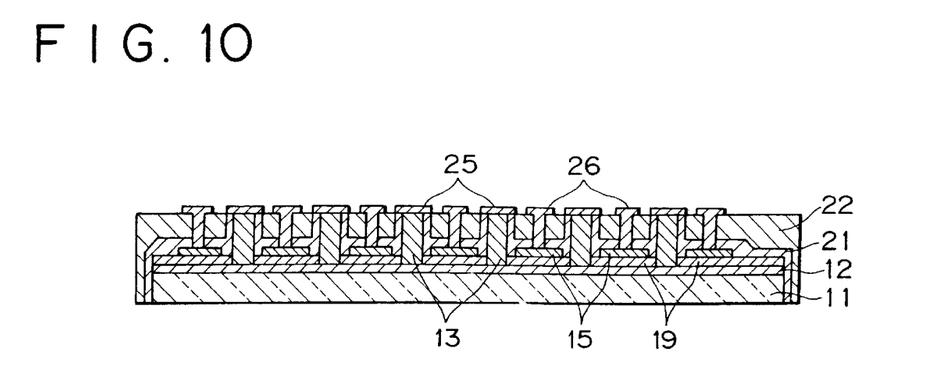
FIG. 10 is a schematic sectional view showing a manufacturing step subsequent to that shown in FIG. 9.

Referring to FIG. 9, a conductive layer 24 made from a metal such as gold, copper, nickel or aluminum is formed on the entire surface including the exposed portions of the metal bumps 13 planarized at the preceding step in such a manner as to cover the exposed portions of the metal bumps 13 and to fill the through-holes 27 for the metal electrodes 15. Then, as shown in FIG. 10, the conductive layer 24 is processed into a conductive pattern 25 on the metal bumps 13 and a conductive pattern 26 on the metal electrodes 15. It should be noted that the surfaces of the metal bumps 13 may remain not polished, and the conductive layer 24 may be provided in a state shown in FIG. 7 and then processed into conductive patterns. This is effective to improve the adhesion of the conductive layer 24.

In this way, according to the organic EL device as an optical device in this embodiment, the metal electrodes 15 as the counter electrodes are electrically led onto the hard coat layer 22 via the conductive layer 6 24 deposited in the through-holes 27.

Figure 11:
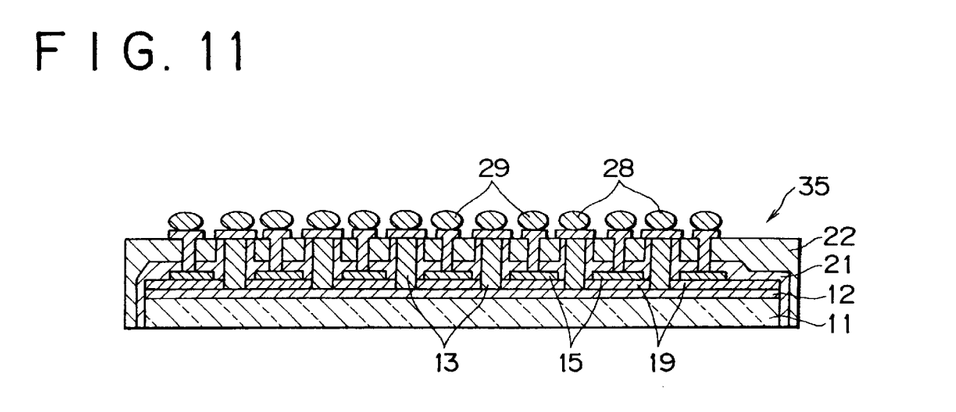
FIG. 11 is a schematic sectional view showing a manufacturing step subsequent to that shown in FIG. 10.

Referring to FIG. 11, the conductive patterns 25 and 26 are coated with conductive pastes 28 and 29 to form contacts, respectively, to form wires and contacts to be connected to driver ICs on the hard coat layer 22.

Figure 12:
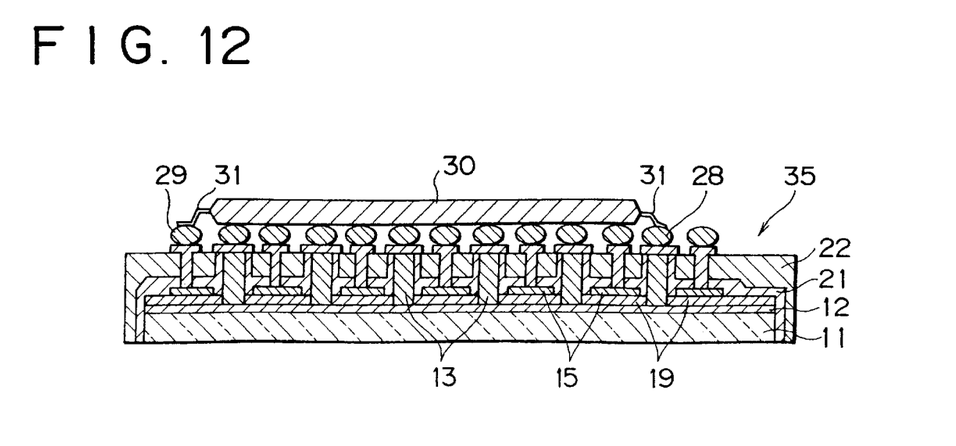
FIG. 12 is a schematic sectional view showing a manufacturing step subsequent to that shown in FIG. 11.

Referring to FIG. 12, the metal bumps 13 and the metal electrodes 15 are connected to an electrical part 30 mounted on the hard coat layer 22 and further connected to driver elements, to constitute a simple matrix type organic EL device. To be more specific, lead terminals of the electronic part 30 are connected to the contacts 28 and 29 made from the conductive pastes.

In summary, the organic EL device in this embodiment is configured such that the first electrode portion composed of the optically transparent electrodes, the organic layer (including the organic hole transfer layer, the organic luminescent layer and/or the organic electron transfer layer), and the second electrode portion composed of the metal electrodes are stacked on the optically transparent substrate.

In this way, according to this embodiment, there can be obtained the desirable organic EL (electroluminescence) device.

Figure 13:
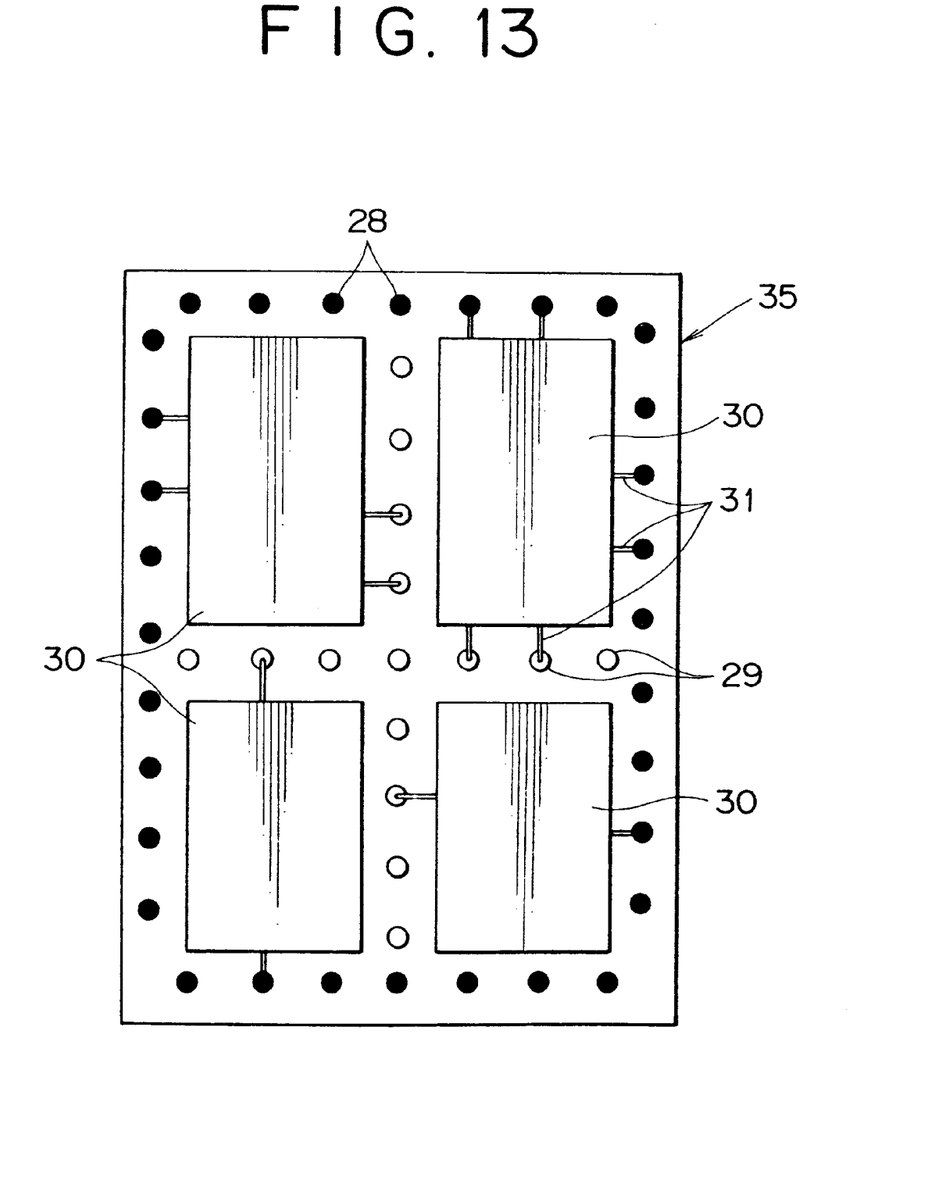
FIG. 13 is a schematic view showing a state in which parts to be mounted are joined to the back surface of the organic EL device.

FIG. 13 is a schematic rear view of an organic EL device 35 manufactured in the above-described method, on which electronic parts 30 are mounted. In FIG. 13, contacts 28 formed by conductive paste on metal bumps and contacts 29 formed by conductive paste on metal electrodes, which are led onto the hard coat layer on the back surface of the organic EL device 35, are designated by black dots and white dots, respectively. In actual, a large number of these contacts 28 and 29 are formed; however, they are simply shown in the figure for an easy understanding. The electronic parts 30 are also schematically shown.

As shown in FIG. 13, the electronic parts 30 can be mounted on, that is, connected to the back surface of the organic EL device 35 in this embodiment because transparent electrodes 12 as anodes are led on the back surface of the organic EL device 35 via the metal bumps 13 and metal electrodes 15 as cathodes are also led on the back surface of the organic EL device 35 via a conductive pattern 26.

The transparent electrodes 12 may be divided into a plurality of blocks, and the organic EL device 35 may be connected to the electronic parts 30 to be driven for each block.

Figure 14:
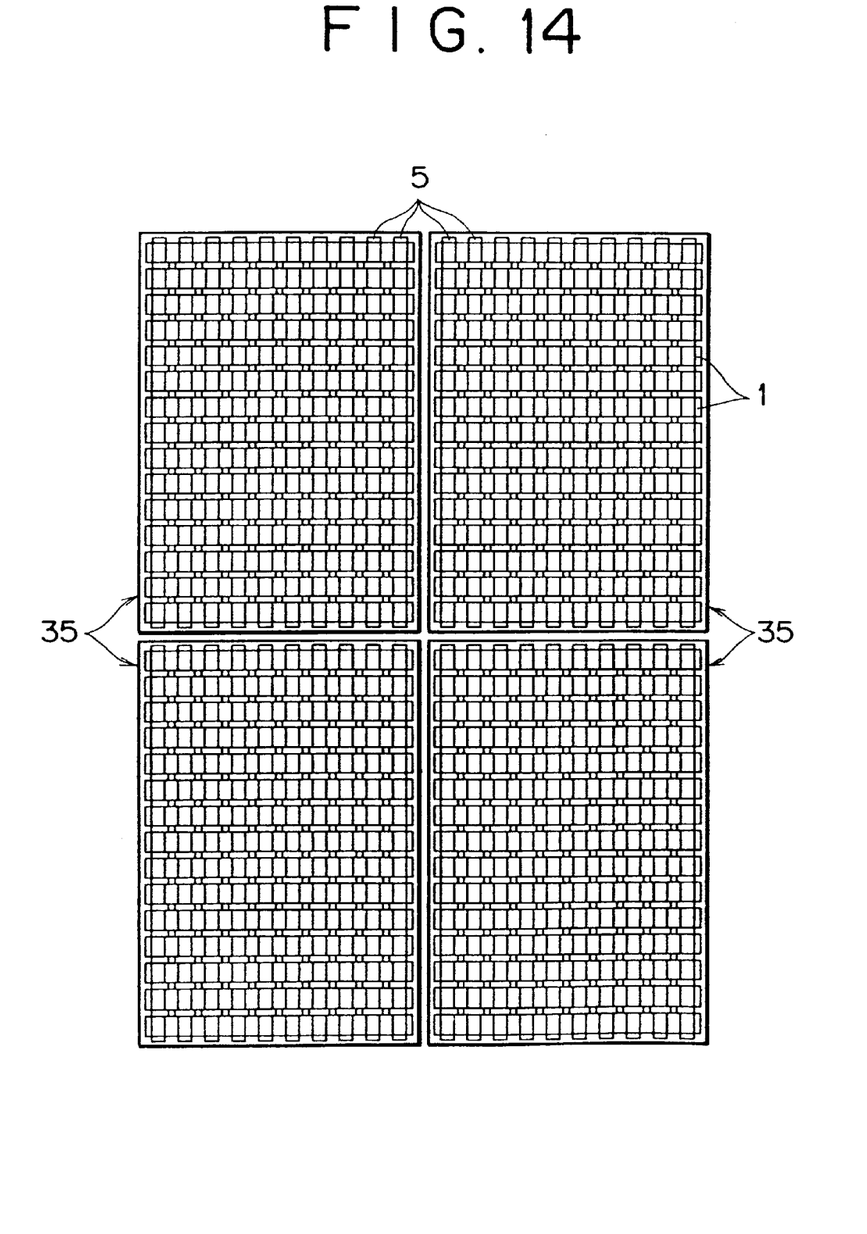
FIG. 14 is a plan view showing a state in which the organic EL devices are arranged on a display.

According to the present invention, it is not required to lead the row and the column electrodes up to the outer side of a screen region of the organic EL device 35 for wiring thereof, unlike the related art organic EL device. As a result, as shown in FIG. 14, a plurality of the organic EL devices 35 can be flatly arranged without gaps put therebetween, to thus form a screen of a display.

At the steps shown in FIGS. 7 to 11, when the exposed portions of the metal bumps 13 are electrically led onto the hard coat layer 22 via the conductive layer 24 formed on the hard coat layer 22 in such a manner as to cover the exposed portions of the metal bumps 13, the conductive layer 24 can be desirably stuck on the exposed portions of the metal bumps 13 because the top surfaces of the metal bumps 13 are equal to or less than the top surface of the hard coat layer 22. This is effective to facilitate formation of wiring for the metal bumps 13 and hence to stabilize the mounting of the electronic parts 30.

While the preferred embodiment of the present invention has been described using specific terms, such description is for illustrative purposes only, and it is to be understood that changes and variations may be made without departing from the technical thought of the present invention.

For example, according to the above-described embodiment, a large number of the metal bumps 13 are formed in the non-optical operation regions; however, the number and the arrangement of the metal bumps 13 are not limited thereto. In rare cases, only one metal bump 13 may be formed. Even such only one metal bump 13 can function as a spacer. In general, however, to enhance the connection function to a part to be mounted, a plurality of the metal bumps 13 may be formed into a cross-shape or a square shape. The metal bumps 13 formed into such a shape can keep not only the good connection characteristic to a part to be mounted but also the stability as spacers. Also the contacts 28, 29 made from the conductive paste can be formed into various patterns. Further, the connection of a part to be mounted can be performed in accordance with not only the above-described lead type method but also a lead-less type method such as a face-down type method.

The material, shape and size of the metal bump may be changed from those described in the embodiment.

The material, shape and the like of each component other than the metal bump in the organic EL device may be changed from those described in the embodiment.

The organic EL device in the embodiment can be applied not only to the simple matrix type organic EL device but also to a natural light emission type luminescence device such as an active matrix type organic EL device, and further applied to a general light modulation device such as an ECD (electrochromic display device) or an LCD (liquid crystal display device).

According to the above-described embodiment, since the metal bumps 13 are provided on the transparent electrodes 12 in the non-optical operation regions in such a manner that the metal bumps 13 are higher than the metal electrodes 15 as the cathodes, the metal bumps 13 can function as spacers, so that it is possible to prevent from damaging the luminescent pixel regions upon formation of the organic EL layer by vapor-deposition using a mask or the subsequent screen printing of the hard coat layer.

With respect to the hard coat layer 22 formed by screen printing, since the thickness of the hard coat layer 22 on the metal bumps 13 is small, it is possible to reduce a time and energy required to form through-holes for exposing the surfaces of the metal bumps to be wired and hence to improve the productivity. Further, by forming the metal bumps 13 in such a manner that the metal bumps sufficiently project with respect to the surface of the hard coat layer 22, the metal bumps 13 can be exposed not by laser processing but by polishing which is simpler in structure and higher in productivity than laser processing. The polishing has another advantage in eliminating occurrence of abrasion of ITO upon formation of through-holes by laser processing.

What is claimed is:

1. A method of manufacturing an optical device in which a stacked body is provided on electrodes arranged in a base in such a manner as to cover at least optical operation regions and the top surface of said stacked body is covered with an insulating layer, said method comprising the steps of:

forming conductive projections on said electrodes in such a manner that said projections are located in non-optical operation regions and the top surfaces of said projections are higher than the top surface of said stacked body; and disposing a mask on said projections which are taken as spacers, and forming layers constituting said stacked body through said mask.

2. A method of manufacturing an optical device according to claim 1, further comprising the steps of:

forming said electrodes on said base using a first mask having a specific pattern;

forming said projections having a specific pattern in said non-optical operation regions on said electrodes by a physical vapor-deposition method or a plating method; and disposing a second mask having a specific pattern on said projections, and forming at least counter electrodes facing to said electrodes, among components of said stacked body by the physical vapor-deposition method.

3. A method of manufacturing an optical device according to claim 2, further comprising the steps of:

forming, after formation of said counter electrodes, an insulating layer over the entire surface; and exposing the top surfaces of said projections by removing part of said insulating layer as needed.

4. A method of manufacturing an optical device according to claim 3, further comprising the step of:

planarizing, after exposure of the top surfaces of said projections, the top surfaces of said projections by polishing.

5. A method of manufacturing an optical device according to claim 4, further comprising the steps of:

depositing a conductive layer on exposed portions of said projections as metal bumps in such a manner as to cover them; and processing said conductive layer into a conductive pattern.

6. A method of manufacturing an optical device according to claim 3, wherein said step of forming said insulating layer comprises the step of forming a protective layer and a hard coat layer in this order.

7. A method of manufacturing an optical device according to claim 3, further comprising the steps of:

forming said insulating layer in such a manner that the top surfaces of said projections in a state being buried in through-holes formed in said insulating layer are nearly equal to or less than the top surface of said insulating layer; and electrically leading said projections onto said insulating layer.

8. A method of manufacturing an optical device according to claim 3, further comprising the step of:

connecting said projections to an electronic part mounted on said insulating layer.

9. A method of manufacturing an optical device according to claim 8, further comprising the step of:

connecting said electrodes to driver elements arranged on said insulating layer by means of said projections, to constitute a simple matrix type luminescence device composed of said stacked body.

10. A method of manufacturing an optical device according to claim 1, further comprising the step of:

electrically leading counter electrodes, which have been provided in said optical operation regions in such a manner as to face to said electrodes, onto said insulating layer via a conductive layer deposited in throughholes formed in said insulating layer.

11. A method of manufacturing an optical device according to claim 10, further comprising the step of:

connecting said counter electrodes to an electronic part mounted on said insulating layer.

12. A method of manufacturing an optical device according to claim 11, further comprising the step of:

connecting said counter electrodes to said stacked body constituting a simple matrix type luminescence device and to driver elements arranged on said insulating layer.

13. A method of manufacturing an optical device according to claim further comprising the step of:

stacking on an optically transparent base, a first electrode portion composed of transparent electrodes; at least one selected from the group consisting of an organic hole transfer layer, an organic luminescent layer, and an organic electron transfer layer; and a second electrode portion composed of metal electrodes.

14. A method of manufacturing an optical device according to claim 13, wherein said optical device comprises an organic electroluminescence element.

* * * * *